United States Patent
Yang

(10) Patent No.: US 8,232,159 B2
(45) Date of Patent: Jul. 31, 2012

(54) PHASE CHANGE MEMORY DEVICE HAVING BURIED CONDUCTION LINES DIRECTLY UNDERNEATH PHASE CHANGE MEMORY CELLS AND FABRICATION METHOD THEREOF

(75) Inventor: Ki Ho Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/402,164

(22) Filed: Feb. 22, 2012

(65) Prior Publication Data

US 2012/0149167 A1  Jun. 14, 2012

Related U.S. Application Data

(62) Division of application No. 12/641,561, filed on Dec. 18, 2009, now Pat. No. 8,124,970.

(30) Foreign Application Priority Data

Jun. 1, 2009  (KR) ..................... 10-2009-0047967

(51) Int. Cl.
*H01L 21/8234* (2006.01)
*H01L 29/00* (2006.01)
(52) U.S. Cl. .......................... 438/237; 257/46
(58) Field of Classification Search .................. 438/237, 438/979; 257/2–4, 46, E21.068, E21.589
See application file for complete search history.

(56) References Cited

U.S. PATENT DOCUMENTS

| 7,804,086 | B2 * | 9/2010 | Chang ............................. 257/4 |
| 7,879,729 | B2 * | 2/2011 | Jung ............................ 438/703 |
| 7,883,958 | B2 | 2/2011 | Park |
| 7,893,421 | B2 | 2/2011 | Lee et al. |

FOREIGN PATENT DOCUMENTS

| KR | 1020070069364 A | | 7/2007 |
| KR | 1020090026676 | * | 3/2009 |
| KR | 1020090026676 A | | 3/2009 |
| KR | 1020090051506 | * | 5/2009 |
| KR | 1020090051506 A | | 5/2009 |

OTHER PUBLICATIONS

USPTO RR mailed May 2, 2011 in connection with U.S. Appl. No. 12/641,561.
USPTO NFOA mailed Jul. 20, 2011 in connection with U.S. Appl. No. 12/641,561.
USPTO NOA mailed Oct. 25, 2011 in connection with U.S. Appl. No. 12/641,561.

* cited by examiner

*Primary Examiner* — Calvin Lee
(74) *Attorney, Agent, or Firm* — Ladas & Parry LLP

(57) ABSTRACT

A phase change memory device having buried conduction lines directly underneath phase change memory cells is presented. The phase change memory device includes buried conduction lines buried in a semiconductor substrate and phase change memory cells arranged on top of the buried conductive lines. By having the buried conduction lines directly underneath the phase change memory cells, the resultant device can realize a considerable reduction in size.

3 Claims, 3 Drawing Sheets

PHASE CHANGE MEMORY DEVICE HAVING BURIED CONDUCTION LINES DIRECTLY UNDERNEATH PHASE CHANGE MEMORY CELLS AND FABRICATION METHOD THEREOF

CROSS-REFERENCES TO RELATED APPLICATION

The present application is a Divisional Application of Ser. No. 12/641,561, filed Dec. 18, 2009, now U.S. Pat. No. 8,124, 970, issued Feb. 28, 2012; which claims priority under 35 U.S.C. 119(a) to Korean application number 10-2009-0047967, filed on Jun. 1, 2009, in the Korean Patent Office, which is incorporated by reference in its entirety as if set forth in full.

BACKGROUND

1. Technical Field

The embodiments described herein relate to a semiconductor memory device and, more particularly, to a phase change memory device and a method for manufacturing the same.

2. Related Art

A phase change random access memory (PRAM) is a memory device that can be used to stores a set status or a reset status by using resistance differences exhibited from different solid state phases of the phase change material. It should accurately control the resistance of the memory cell. The PRAM includes the contact and the wiring layer for draining the current of the active region to the external of the device in order to control the resistance of the memory cell.

FIG. 1 is a sectional view of a conventional phase change memory device. Referring to FIG. 1, on active regions of a semiconductor substrate 101 which an isolation layer 103 is formed therein, memory cells each including a diode 105, a bottom electrode contact 107 and a phase change pattern 109 are arranged. Top electrode contacts 111 and first conduction patterns 113 are arranged on the phase change patterns 109.

Meanwhile, current control contacts 115 and a second conduction pattern 117 are electrically connected, i.e., coupled, together. The current control contacts 115 and the second conduction pattern 117 drain the current generated in driving the memory cells of the device. The second conduction pattern 117 is configured to be electrically connected to the current control contacts 115.

The phase change memory device should accurately sense a difference in the current across the memory cell as a function of solid state phase the phase change material. However, if the resistance of the active region is greater than a predetermined level, then the PRAM will not be able to adequately sense a current difference between the logic level "0" and the logic level "1" and thereby the PRAM will fail to operate normally.

To protect against encountering this type of problem, the current control contact 115 and the second conduction pattern 117 are introduced to drain the current of the active region away to the outside, as shown in FIG. 1

FIG. 2 is a lay out of the conventional phase change memory device. A plurality of memory cells 120 are arranged in each of a plurality of cell arrays. Core regions are arranged between adjacent cell arrays.

Contact regions 130 which current control contacts 115 are formed therein are arranged at both sides of each of the plurality of cell arrays. Currently, since the current control contacts 115 are repeatedly arranged next to blocks of 8 memory cell units, the size of the chip is increased by about 13%.

Although the current control contacts are used only to drain the current of the active region, current control contacts occupy a considerable portion of the chip size. Furthermore, to form the current control contacts 115, four masks are required to carry out several process steps (up to tens or process steps) using these four masks.

In the prior art phase change memory device, the resistance of the current control contacts is lower than the active region. However, the chip size of the prior art phase change memory device is considerably increased and additional processes are needed to form the current control contacts which thereby lowers the production efficiency.

SUMMARY

The inventive concept provides a phase change memory device and a method for manufacturing the same being capable of scaling down the chip size and effectively controlling the current in an active region.

According to one aspect of an example embodiment, a phase change memory device includes buried conduction lines configured to be buried in a semiconductor substrate and phase change memory cells arranged on the buried conduction lines.

According to another aspect of another example embodiment, a phase change memory device includes an isolation layer formed in a semiconductor substrate, buried conduction lines arranged in portions of the semiconductor substrate defined by the isolation layer such that upper surfaces of the buried conduction lines are exposed, and switching devices arranged on the buried conduction lines.

According to still another aspect of another example embodiment, a method for manufacturing a phase change memory device includes providing a semiconductor substrate which active regions are defined therein, forming trenches in the active regions of the semiconductor substrate, forming buried conduction lines by filling conduction lines within the trenches, and forming phase change memory cells on the buried conduction lines.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
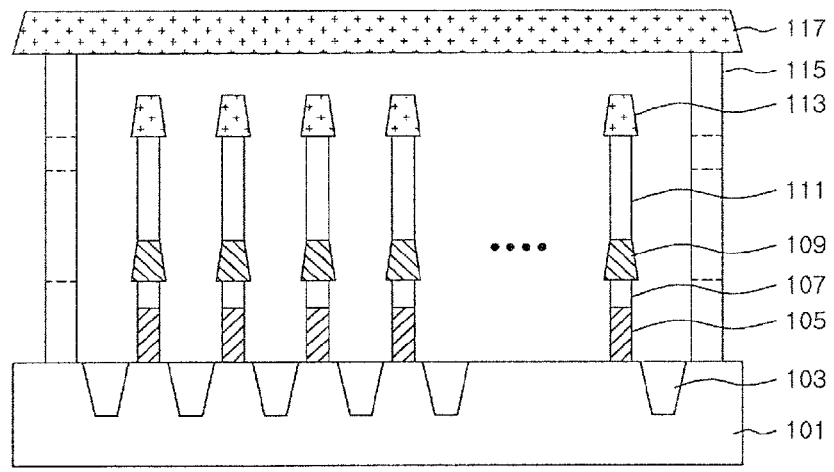
FIG. 1 is a schematic sectional view of a prior phase change memory device.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements.

FIGS. 3 to 7 are sectional views illustrating a manufacturing process of a phase change memory device according to an example embodiment.

Figure 3:
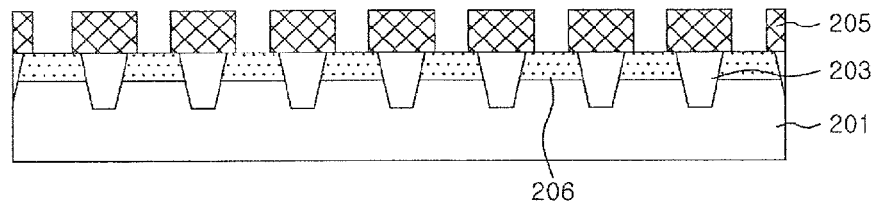
FIGS. 3 through 7 are sectional views illustrating a method for manufacturing a phase change memory device according to an example embodiment.

First, referring to FIG. 3, an isolation layer 203 is formed in a semiconductor substrate 201 to define active regions in which memory cells are to be formed therein.

A mask pattern 205 is formed to expose portions of the active regions corresponding to memory cell formation regions. After forming the mask pattern 205, an ion implantation process is performed to form junction regions 206 in the active regions.

Figure 4:
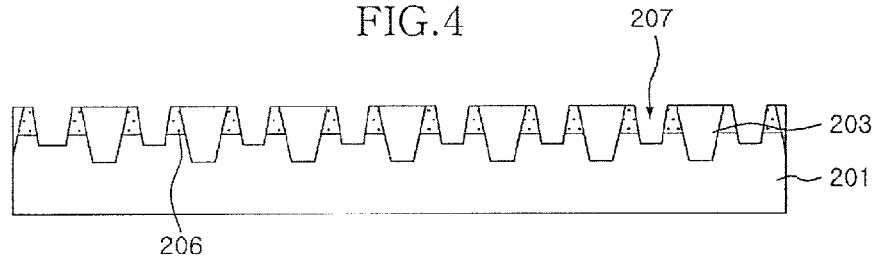

Next, referring to FIG. 4, the exposed portions of the junction regions 206 in the active regions are down etched to a desired depth to form trenches 207 by using an exposure and etching process using the mask pattern 205. The trenches 207 are configured to be contacted with the junction regions 206.

Figure 5:
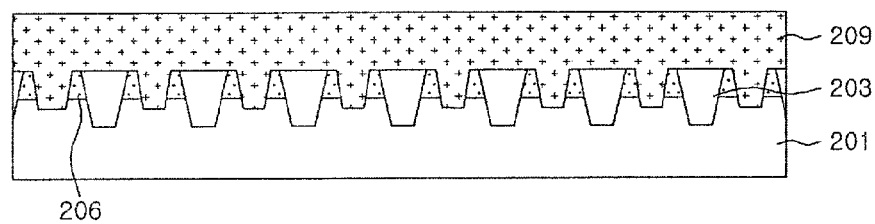
Figure 6:
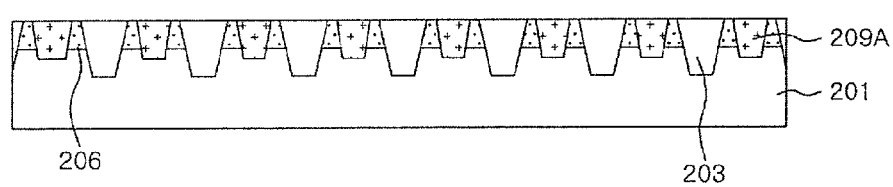

Referring to FIG. 5, a conduction layer 209 is formed on the whole surface of the semiconductor substrate 201 in order to fill in the trenches 207. Referring to FIG. 6, a planarization process is subsequently performed to expose a surface of the semiconductor substrate 201. As a result of the planarization process, buried conduction lines 209A are formed where the trenches 207 used to be.

Figure 7:
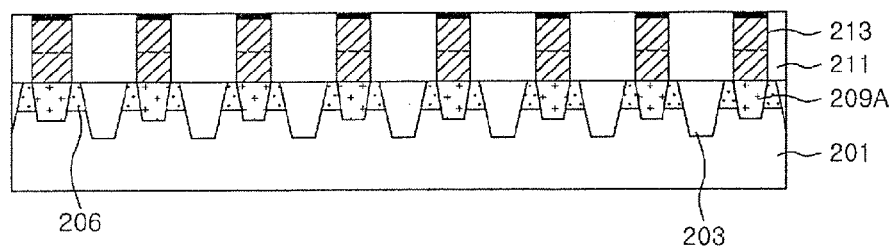

Referring to FIG. 7, an interlayer insulating layer 211 is formed on the whole surface of the semiconductor substrate 201 and patterned to expose upper surfaces of the buried conduction lines 209A. Then, diodes 213 are formed on the exposed upper surfaces of the buried conduction lines 209A.

The diodes 213 are preferably used to serve as switching devices of the phase change memory device. A process for forming a bottom electrode contact, a phase change material layer and a top electrode on each of the diode 213 may be performed by using any n number of well known conventional PRAM fabrication processes. Therefore, the description to the fabrication process will be omitted therein.

The buried conduction lines 209A which are formed in the semiconductor substrate 201 by using the above fabrication process drain the current generated during the operation of the phase change memory cells through the semiconductor substrate 201.

In the prior phase change memory device, the current control contacts are formed by using eight memory cell units so as to drain the current of the active region. However, in the example embodiment, since the buried conduction lines 209A are arranged in the semiconductor substrate 201 below the memory cells then the additional process for forming contacts is not needed, and as a result the current of the active region is lowered without the need of arranging the spare region for the contacts.

The control of the current in the active region is directly linked to sense the resistance difference of the memory cell such that it can ensure normal operations of the memory cell with a minimized chip size and a simplified fabrication process.

As above, in the example embodiment, the phase change memory device includes the buried conduction lines 209A formed in the active regions of the semiconductor substrate 201. The memory cells each including a diode, a bottom electrode contact (not shown), a phase change material layer (not shown) and a top electrode (not shown) formed on the buried conduction lines 209A. The current remaining by operating the memory cells can be substantially drained through the buried conduction lines 209A.

Figure 8:
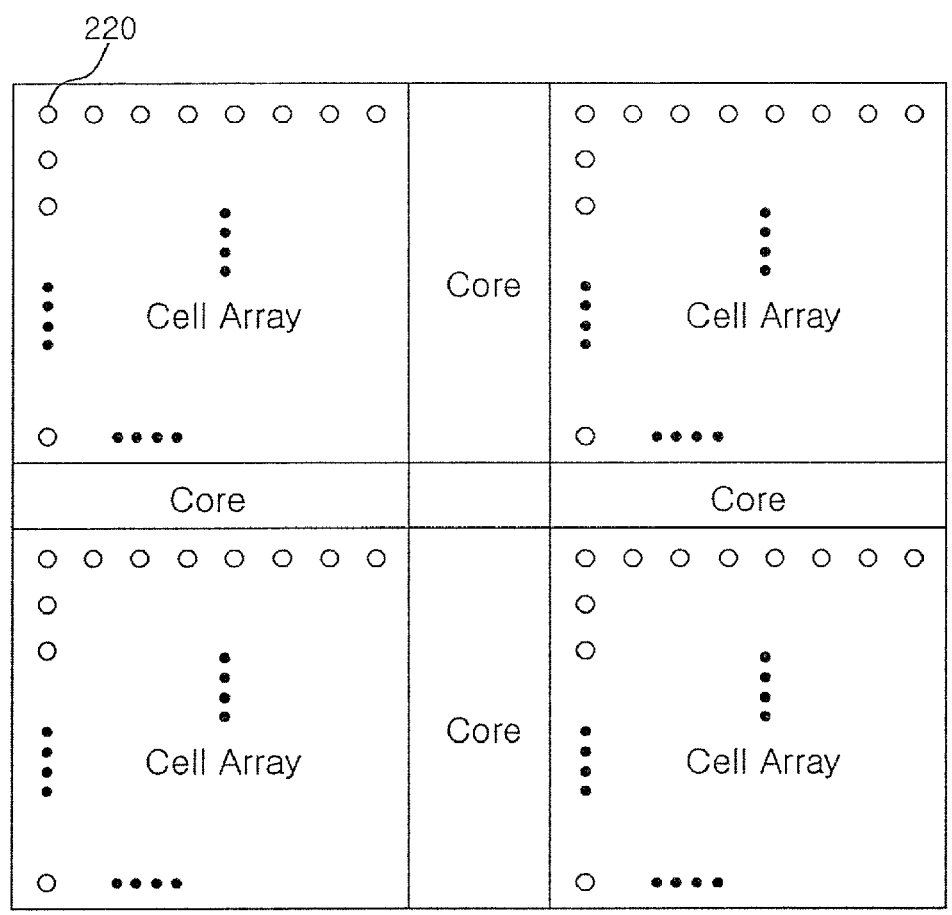
FIG. 8 is a lay out of the phase change memory device according to an example embodiment.

FIG. 8 is a lay out of the phase change memory device according to an example embodiment. Referring to FIG. 8, in the phase change memory device of an example embodiment, the conduction lines 209A are configured to be buried in a semiconductor substrate below memory cells 220. The buried conduction lines 209A control the current of the active region such that separate contacts for draining the current of the active region are not needed as well as the additional areas occupied by separate contacts are also not needed.

Figure 2:
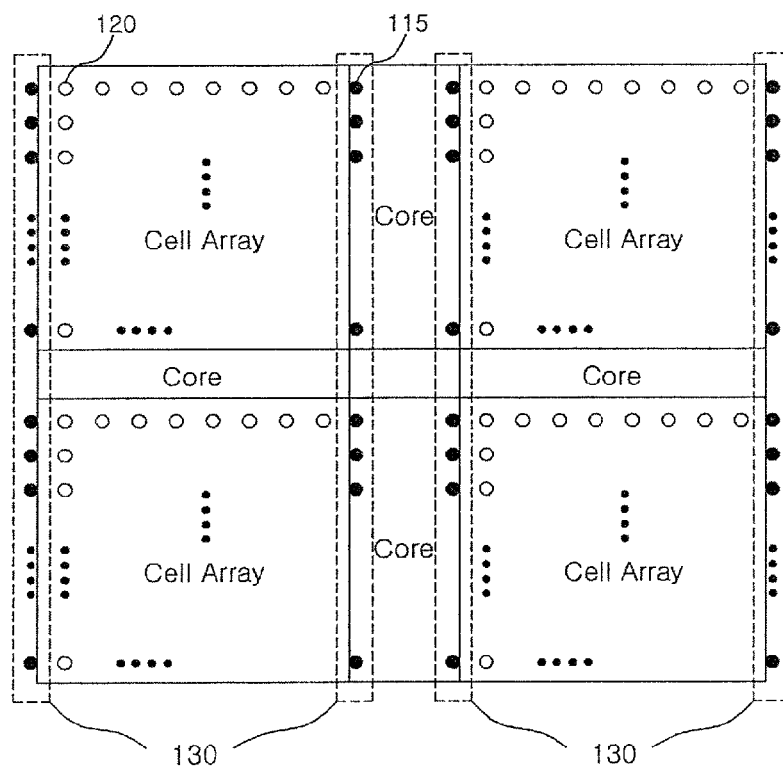
FIG. 2 is a lay out of the phase change memory device.

As compared with FIGS. 2 and 8, the contact regions 130 in which the current control contacts are disposed therein adjacent to eight memory cell units are arranged in the prior art phase change memory device of FIG. 2. However, in the example embodiment of the present invention, the buried conduction lines 209A perform the substantially the same operations as that of the current control contacts of the prior art phase change memory device. Accordingly, as seen in the lay out of FIG. 8, the integrity of the memory cell can be increased and the size of the memory cell can be scaled down by eliminating the undesired extra additional areas needed in the prior art phase change memory device.

In the phase change memory device, the current of the active region should be controlled so as to accurately sense the resistance difference of the phase change material. In the example embodiment, before forming the switching device, the buried conduction lines are formed in the semiconductor substrate so as to control the current of the active region. The current remaining in the active region during operation of the phase change memory device is drained through the buried conduction lines so that it can more accurately sense the difference between the set status and the reset status, thereby ensuring the operation stability of the device.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method for manufacturing a phase change memory device, comprising:
    providing a semiconductor substrate which active regions are defined therein;
    forming trenches in the active regions of the semiconductor substrate;
    forming buried conduction lines by filling in the trenches with a conduction layer; and
    forming phase change memory cells on the buried conduction lines, wherein forming trenches includes:
    forming a mask pattern on an upper surface of the semiconductor substrate to expose portions of the active regions; and
    etching the exposed portions of the active regions in the semiconductor substrate down to a desired depth using the mask pattern as an etch mask.

2. The method of claim 1, wherein forming buried conduction lines includes:
    forming the conduction layer on the surface of the semiconductor substrate; and performing an planarization process to expose the surface of the semiconductor substrate.

3. The method of claim 2, wherein forming buried conduction lines is performed such that the upper surface of the semiconductor substrate is substantially coplanar with upper surfaces of the buried conduction lines.

* * * * *